(12) United States Patent
Amstutz et al.

(10) Patent No.: US 7,390,551 B2
(45) Date of Patent: *Jun. 24, 2008

(54) SYSTEM AND METHOD FOR ENCAPSULATION AND PROTECTION OF COMPONENTS

(75) Inventors: Aaron K. Amstutz, Princeville, IL (US); Thomas J Grabenstetter, Metamora, IL (US); Randall G. Sommer, Sparland, IL (US); Christopher J. Stickling, Dunlap, IL (US)

(73) Assignee: Caterpillar Inc., Peoria, IL (US)

( * ) Notice: Subject to any disclaimer, the term of this patent is extended or adjusted under 35 U.S.C. 154(b) by 305 days.

This patent is subject to a terminal disclaimer.

(21) Appl. No.: 10/884,722

(22) Filed: Jul. 2, 2004

(65) Prior Publication Data

US 2006/0003137 A1   Jan. 5, 2006

(51) Int. Cl.
*B32B 1/04* (2006.01)
(52) U.S. Cl. ............................. 428/68; 428/76
(58) Field of Classification Search ............. 428/68, 428/76
See application file for complete search history.

(56) References Cited

U.S. PATENT DOCUMENTS

| | | | | |
|---|---|---|---|---|
| 3,980,607 | A * | 9/1976 | Johannes | 523/440 |
| 4,008,198 | A * | 2/1977 | Krohberger et al. | 524/864 |
| 4,163,072 | A | 7/1979 | Soos | |
| 4,695,926 | A | 9/1987 | McDermott | |
| 5,244,707 | A * | 9/1993 | Shores | 428/76 |
| 5,455,390 | A | 10/1995 | DiStefano et al. | |
| 5,686,541 | A | 11/1997 | Wang et al. | |
| 5,736,190 | A | 4/1998 | Usifer et al. | |
| 5,755,026 | A | 5/1998 | Stephan et al. | |
| 5,956,576 | A | 9/1999 | Toy et al. | |
| 6,045,652 | A | 4/2000 | Tuttle et al. | |
| 6,420,262 | B1 | 7/2002 | Farrar | |
| 6,425,655 | B1 | 7/2002 | Patil | |
| 6,439,698 | B1 | 8/2002 | Patil | |
| 6,458,628 | B1 | 10/2002 | Distefano et al. | |
| 2003/0204019 | A1 * | 10/2003 | Ding et al. | 525/191 |
| 2004/0043515 | A1 * | 3/2004 | Goller et al. | 438/1 |

FOREIGN PATENT DOCUMENTS

| | | |
|---|---|---|
| DE | 2951063 | 6/1981 |
| EP | 0308676 | 3/1989 |

OTHER PUBLICATIONS

Patent Abstracts of Japan/Sumitomo vol. 010, No. 236 of Aug. 15, 1986 JP 61-067246, Apr. 7, 1986.

* cited by examiner

*Primary Examiner*—Jane Rhee
(74) *Attorney, Agent, or Firm*—Kevin Earle; Richard Chang; Finnegan, Henderson, Farabow, Garrett & Dunner

(57) ABSTRACT

A system and method for encapsulating and protecting a component assembly is disclosed. A barrier system comprising a first layer having a first set of physical properties and a second layer having a second set of physical properties is adapted to protectively surround the component assembly. A continuous transitory material is formed between the first layer and the second layer at associated first and second margin portions such that the first layer and the second layer are not prone to delamination. The physical properties of each layer of the barrier system provide protection to the component assembly from various types of physical and environmental damage.

26 Claims, 2 Drawing Sheets

Fig_3_
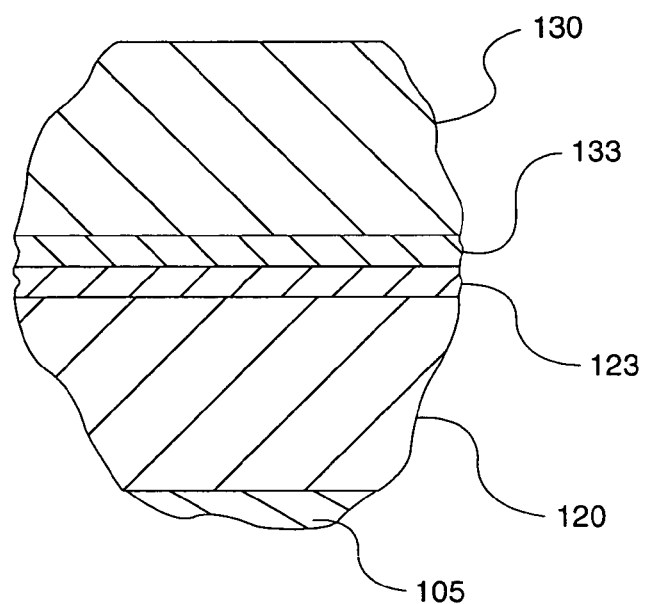
Fig_4_
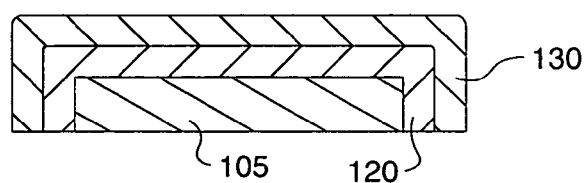
Fig_5_
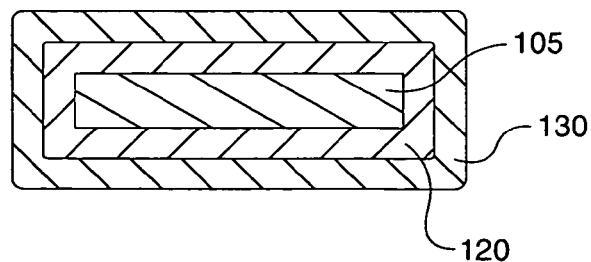

SYSTEM AND METHOD FOR ENCAPSULATION AND PROTECTION OF COMPONENTS

TECHNICAL FIELD

The present invention relates generally to a system and method for encapsulating and protecting a component assembly and, more particularly, to a system and method that uses elastomers to protectively surround and encase at least a portion of the component assembly.

BACKGROUND

It is often necessary to protect sensitive component assemblies, such as circuit boards, from damage due to the environments in which they are being used. Since the electrical components that reside on the surface of these circuit boards are particularly sensitive, damage to these components can result from contamination and corrosion due to dirt, dust, moisture, mildew, or other penetrants such as diesel fuel, etc. coming into contact therewith. Also, physical damage to the electrical component may occur due to direct impact, vibrations, abrasion, handling, etc.

It is known to encapsulate electrical components. For instance, encapsulation to protectively surround a component has traditionally been achieved by encasing the component with a hard polymeric casing and thereafter using silicone, polyurethane, epoxy, or hot melt adhesive to encase the component within the hard casing. The polyurethane or epoxy encapsulating materials are typically injected into the casing at a low pressure to surround the electronics and then is cured in place to position the electronics within the casing.

A problem with known encapsulation methods includes the corrosion or degradation of the sensitive electrical components when moisture penetrates the encapsulant and contacts the components. Moreover, in applications when the component assembly is subject to vibration, the electrical components may debond from the encapsulant. This results in an entry being created for moisture or debris within the encapsulant.

Another problem with the traditionally manufactured assemblies includes providing a sealed, hard outer casing, which is often the most expensive constituent of the package. Further, the hard casing design is usually manufactured by first creating a series of molds that are significantly expensive and not subject to easy design modification. Also, during the assembly process there are multiple steps required to position and encapsulate the component to the casing at additional added expense.

One such example of a known component assembly is disclosed by U.S. Pat. No. 5,755,026. A plastic foam is formed to a desired shape to surround the components. Unfortunately, multiple steps are required to form such an enclosure and the foam filler does not offer enough protection from contamination or impact.

Another example of a component assembly is disclosed by U.S. Pat. No. 5,736,190 is more complex method of fighting moisture and debris, using a reaction of two oligomers to create a cured co-polymer layer around an electrical component. However, this patent is directed at being a moisture barrier and does not provide for any protection from physical damages or impacts that could occur to the component.

Another example of a component assembly is disclosed by U.S. Pat. No. 6,458,628 which discloses a semiconductor chip attachment with a dielectric layer. The dielectric layer is attached to the semiconductor with a thixotropic fluid that is cured to form an encapsulant. Unfortunately, there are multiple steps required to form the dielectric layer and subsequently attach it to the semiconductor chip.

Another known encapsulation assembly is disclosed by U.S. Pat. No. 6,439,698 which discloses a method for creating a dual function encapsulating material. The disclosed epoxy material has two cure mechanisms. After the material is applied to the electrical connections, a first cure is initiated by radiation to crosslink the epoxy materials and encapsulate the electrical connections. Then a second cure is performed with heat to adhere the electrical connections to the body of a cartridge. However, the process by which the materials are joined tends to be time consuming resulting in a multiple step process which is expensive to implement.

SUMMARY OF THE INVENTION

It is to be understood that both the foregoing general description and the following detailed description are exemplary and explanatory only and are not restrictive of the invention as claimed.

One aspect of the present disclosure is directed to a barrier system to protect a component assembly therein. The barrier system comprises a first layer defining a first set of physical properties and including a first margin portion and a second layer defining a second set of physical properties and including a second margin portion. The first layer and the second layer are adapted to encase at least a portion of the component assembly and the first margin portion may be interlinked to the second margin portion to form continuous transitory material therebetween.

Another aspect of the present disclosure is directed to a method of encasing a component assembly with a barrier system. The barrier system includes a first layer defining a first set of physical properties and a second layer defining a second set of physical properties. The method comprises overlaying and interlinking the first layer with a second layer and causing the first layer and the second layer to conform to the shape of the component assembly.

BRIEF DESCRIPTION OF THE DRAWINGS

The accompanying drawings, which are incorporated in and constitute a part of this specification, illustrate several exemplary embodiments of the invention and, together with the description, serve to explain the principles of the invention. In the drawings.

FIG. 3 is a close-up view of the interlinked layers of the cross-sectional view of the exemplary embodiment of the component protection package shown in FIG. 2;

FIG. 4 is a cross-sectional view of a second embodiment of a component protection package according to the present disclosure; and FIG. 5 is a cross-sectional view of a third embodiment of a component protection package according to the present disclosure.

DETAILED DESCRIPTION

Reference will now be made in detail to embodiments of the invention, examples of which are illustrated in the accompanying drawings. Whenever possible, the same reference numbers will be used throughout the drawings to refer to the same or like parts.

Figure 1:
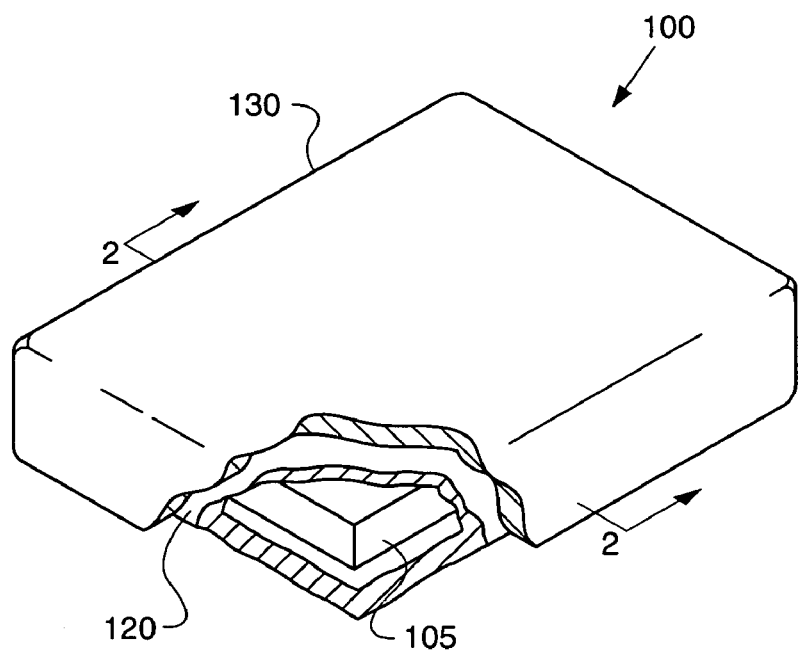
FIG. 1 is a perspective view of an exemplary embodiment of a component protection package according to the present disclosure with a cutaway portion to show the encased component assembly.

FIG. 1 illustrates a component protection package consistent with an exemplary embodiment of the present disclosure, which is generally designated by 100. The component protection package 100 includes a barrier system 110 surrounding a component assembly 105 such as a circuit board, for example. However, the component assembly 105 may be any number of items that could be subject to harsh environments and impacts or vibrations.

Figure 2:
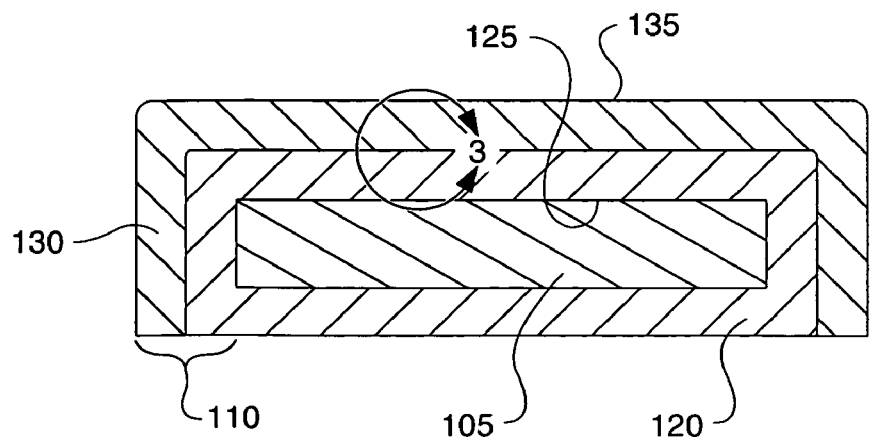
FIG. 2 is a cross-sectional view of the exemplary embodiment of the component protection package shown in FIG. 1.

FIG. 2 is a cross-sectional view of the exemplary embodiment of the component protection package shown in FIG. 1. Referring to FIG. 2, the barrier system 110 includes a first layer 120 that may be overlayed, at least in part, by a second layer 130. The barrier system also comprises an inner surface 125 that may contact the component assembly 105 and an outer surface 135. The first layer 120 that has been adapted to surround the component assembly 105 generally has a pliable structure. The inner surface 125 of the barrier system 110 may generally be in contact with the component assembly 105 and may be physically or chemically bonded to the component assembly 105. The structure of the second layer 130 that may overlay the first layer 120 may generally be rigid and the outer surface 135 may constitute a hard outer shell of the barrier system 110.

FIG. 3 is a close-up view of the interlinked layers of the cross-sectional view of the exemplary embodiment of the component protection package shown in FIG. 2. Referring to FIG. 3, the first layer 120 includes a first margin portion 123 that comes into contact with the second margin portion 133 of the second layer 130. The first margin portion 123 of the first layer 120 may be interlinked to the second margin portion 133 of the second layer 130 such that the layers are not prone to delamination. This is generally because of a continuous transitory material that may be formed where the first margin portion 123 of the first layer 120 interlinks with the second margin portion 133 of the second layer 130. Together, the first layer 120 and the second layer 130 are structured and arranged to encase the component assembly 105.

These layers may generally be comprised of elastomers or similar materials that have the necessary structure and are capable of being interlinked together to encase the component assembly 105 and provide multiple degrees of protection to the component assembly 105. Proper selection of these materials may allow for the first margin portion 123 to be interlinked to the second margin portion 133 such that the transitory material is formed having physical characteristics, different from that of the materials comprising the first layer 120 and the second layer 130.

In one possible embodiment using elastomers, the first layer 120 may comprise a first elastomer and the second layer 130 may comprise a second elastomer. The first elastomer may be formulated for low stiffness, lower than that of the second elastomer, to give it a pliable structure. The second elastomer may be formulated for a high stiffness, higher than that of the first elastomer, to create a rigid structure. The stiffness of elastomers and other similar materials may be measured using the material Shore hardness. The first elastomer may typically have a Shore A hardness between 25 and 60. The second elastomer may typically have a Shore D hardness between 35 and 80.

The second elastomer may generally be selected having a similar base elastomer to the first elastomer with a similar cross-linking agent. The cross-linking agent is what generally causes the molecules within the first elastomer to become irreversibly connected to the molecules in the second elastomer. The cross-linking agent is activated once it reaches its activation temperature and should be selected such that it has an activation temperature at a low enough temperature so that the temperature would not damage the chosen component assembly 105. The cross-linking agent may be, but is not limited to, peroxide based or sulfur based cross-linking agents.

One method of formulating the first elastomer is to use high plasticizer loadings in a lightly filled elastomer. One method for formulating the second elastomer is to use high filler loadings in an elastomer and thermoplastic polymer blend. The thermoplastic polymer should be chosen so that it is compatible with the elastomer and has a glass transition temperature below the cross-linking temperature of the formulation and below the desired maximum processing temperature. The thermoplastic polymer can be any one of a number of materials, such as thermoplastic epoxy, amorphous polyamide, styrenic, cellulosic, and non-crystalline polyesters, for example, or any other material known by those of ordinary skill in the art.

A variety of polymer combinations have also been found acceptable for the first elastomer and the second elastomer. A first combination of polymers could consist of using millable polyurethane with dioctylsebacate or aliphatic oil as a plasticizer for the first elastomer and millable polyurethane with thermoplastic epoxy for the second elastomer. Another combination of polymers could consist of using nitrile rubber with oligomeric polyisoprene as a plasticizer for the first elastomer and nitrile rubber with high temperature polyamide hot melt adhesive for the second elastomer. Another combination of polymers could consist of using nitrile rubber with oligomeric polyisoprene as a plasticizer for the first elastomer and nitrile PVC copolymer with additional PVC powder for stiffening and thermoplastic properties for the second elastomer. Although these three combinations are mentioned, the first elastomer and the second elastomer could comprise any number of combinations, and still be consistent with the present disclosure, where a compatible base elastomer is utilized.

Proper selection of materials may also enable various component assemblies 105 to be encased by the barrier system 110. For instance, when using radio frequency identification (RFID) tags, the materials chosen for the first layer 120 and the second layer 130 would be very important to their operation. In instances such as this, materials would need to be selected that are transparent to the transmission of those radio frequencies.

Although the barrier system 110 is structured and arranged about the component assembly 105 such that it is protectively surrounded, the component assembly 105 may also have such inherent rigidity and strength that it may increase the overall rigidity and strength of the barrier system 110. Depending on the size and shape of the component assembly 105 and where it is used, the barrier system 110, by incorporating the structure and functionality of the component assembly 105, may be more resilient to physical damage due to bending or impact.

FIGS. 4 and 5 are cross-sectional views of a second embodiment and a third embodiment of a component protection package 100. These component protection packages 100 differ from FIG. 2 in the degree to which the first layer 120 and the second layer 130 extend about the component assembly 105. FIG. 4 shows a component protection package with the barrier system 110 being structured and arranged about the component assembly 105 such that one side of the component assembly is not encased. FIG. 5 shows a component protection package where the first layer 120 is structured and arranged about the component assembly 105 on all sides and the second layer 130 is structured and arranged about the first layer 120 on all sides.

The present application contemplates various alternatives for the first and second layers, such as, for example, the first layer 120 and the second layer 130 may include distinct sub-layers designed for additional protection of the component assembly 105. These additional sub-layers may also be designated separately as an interlinked layer of the encapsulation system, or one of a plurality of layers designed for additional protection of the component assembly 105 such that there may be an additional generally pliable outer layer. Furthermore, each of the layers previously described are interchangeable such that the first layer 120 may be generally rigid while the second layer 130 may be generally pliable.

A method of creating a barrier system to protect a component therein comprises causing a first layer of the barrier system to be interlinked with a second layer of the barrier system and causing the first layer and the second layer to be molded so as to surround the component. After a component 105 is selected for encapsulation and protection, the materials and the processing method are selected. Selection of the materials and processing method may be done such that the first margin portion 123 of the first layer 120 may be interlinked to the second margin portion 133 of the second layer 130 and the inner surface 125 may be formed to the component assembly 105. The degree of protection and the amount of the component assembly 105 that will be encased may be determined based upon foreseeable use. This will enable the calendaring and preforming of the first layer 120 and the second layer 130 to protect the selected component assembly 105 with the predetermined degree of protection.

The first layer 120 may be adapted to protectively surround the component 105. The second layer 130 may be structured and arranged to encase the first layer 120 and the component assembly 105 as needed. Curing may then occur using one of a number of methods including, but not limited to applying heat, pressure, ultraviolet light, or other cure mechanism to the component protection package 100. Compression molding may be used to apply pressure and heat to the mold, but the molding and curing will depend upon the selected materials and their processing characteristics as well as a preferred geometry of the encapsulants. Other molding techniques to mold the layers may include, but is not limited to transfer molding and injection molding. Upon completion of the curing operation, the component protection package 100 may be removed from the mold. It may be necessary to establish a maximum processing temperature for the selected component assembly 105 to ensure that the materials and associated cure operation have a cure temperature that is not above the maximum allowable temperature of the component assembly 105 being protected.

INDUSTRIAL APPLICABILITY

The component protection package 100 comprises a barrier system 110 and a component assembly 105. The barrier system 110 has a first layer 120 that is interlinked to a second layer 130 to conform to the shape of the component assembly 105 and encase at least a part of the component assembly 105. More specifically, interlinking a first margin portion 123 of the first layer 120 and a second margin portion 133 of the second layer 130 creates the barrier system 110.

The first layer 120 and the second layer 130 may work together to prevent damage that each layer alone may not prevent. For example, if something impacts the outer surface of the barrier system 135, the second layer 130 will accept the blow and damage while the first layer 120 will absorb vibrations and movement of the second layer 130 into the first layer 120.

The first layer 120 may be adapted to surround the component and protect the component from environmental damage due to moisture, dirt, dust, debris, diesel fuel, vibration, oil, etc. The second layer 130 may be structured and arranged to encase the first layer 120 and the component assembly 105 to protect the component assembly 105 from physical damage due to handling, impacts, or other damage that the first layer 120 cannot protect. At the same time, the second layer 130 may be required to withstand the same environmental problems as the first layer 120 such that the second layer 130 does not break down and become less resilient to physical damage. By interlinking these layers at the first margin portion 123 and the second margin portion 133, these layers create a barrier system that gives dual functionality protection at a low cost. Proper material selection contributes to this low cost and allows the molding and curing of the layers to be performed in a single operation.

The present disclosure provides an improved system and method for encapsulating and protecting a component assembly 105 from environmental and physical damage. This barrier system 110 serves to protect the component assembly 105 from physical impacts and harsh environments that can result in damage. The barrier system 110 has greater impact strength than many competing enclosures while at the same time providing excellent resistance to vibration, moisture, and debris.

Embodiments of the present disclosure are applicable to a number of situations where electronic components are susceptible to a number of severe environments or physical situations. In a number of industries, the use of RFID tags is important to monitor and track thousands upon thousands of items being moved around. The railroad industry utilizes RFID tags to track railroad cars. Rental stores use RFID tags to track equipment or parts that are being rented out. A variety of machines use RFID tags to monitor which attachment is connected and the number of hours on that attachment. These RFID tags may be placed on railroad cars, equipment, or attachments in locations that cannot always be protected from severe environments or from physical damage. Frequent damage does occur and results in lost parts and equipment. Various embodiments of the present disclosure are readily capable of dealing with this problem in a much more economical and easy way than what is currently being used in the industry to protect these sensitive RFID tags. Not only does this apply to RFID tags, but also to any type of component, electrical or otherwise, used in potentially severe environments or physical situations.

It will be apparent to those skilled in the art that various modifications and variations can be made in the system and method of the present invention without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims and their equivalents.

What is claimed is:

1. A barrier system to protect a component assembly therein comprising:

a first layer defining a first set of physical properties and including a first margin portion; and a second layer defining a second set of physical properties and including a second margin portion, wherein the first set of physical properties includes a stiffness lower than a stiffness of the second set of physical properties, the first margin portion being interlinked to the second margin portion to form a continuous transitory material, wherein the first layer and the second layer utilize a similar base elastomer with a compatible cross-linking agent; and the first layer and the second layer being adapted to encase at least a portion of the component assembly.

2. The barrier system of claim 1, wherein the cross-linking agent is peroxide based.

3. The barrier system of claim 1, wherein the first layer is compounded for the low stiffness and the second layer is compounded for the high stiffness.

4. The barrier system of claim 3, where the first layer has a Shore A hardness between 25 and 60, and the second layer has a Shore D hardness between 35 and 80.

5. The barrier system of claim 3, wherein the second layer comprises:

an elastomer, the elastomer having the same base elastomer as the first layer; and a thermoplastic, the thermoplastic having a glass transition temperature below a cross-linking temperature of the first layer and the second layer, the thermoplastic having a glass transition temperature below a desired maximum processing temperature.

6. The barrier system of claim 5, where the thermoplastic comprises a one of, but not limited to thermoplastic epoxy, amorphous polyamide, styrenic, cellulosic, and non-crystalline polyester.

7. The barrier system of claim 1, wherein the component assembly is an electrical component.

8. The barrier system of claim 1, wherein a radio frequency transmission can occur through the first layer and the second layer.

9. The barrier system of claim 1, wherein the structure of the component assembly adds rigidity and strength to the barrier system.

10. A method of encasing a component assembly with a barrier system, the barrier system including a first layer defining a first set of physical properties and a second layer defining a second set of physical properties, the method comprising:

selecting base elastomers with a compatible cross-linking agent as the first layer and the second layer, the first layer defining a first set of physical properties and the second layer defining a second set of physical properties, wherein the first set of physical properties includes a stiffness lower than a stiffness the second set of physical properties;

interlinking the first layer with the second layer, wherein interlinking the first layer with the second layer includes forming a continuous transitory material at a first margin portion of the first layer and a second margin portion of the second layer; and causing the first layer and the second layer to conform to the shape of the component assembly.

11. The method as set forth in claim 10, wherein and interlinking the first layer with the second layer includes molding and curing the first layer and the second layer around the component assembly.

12. The method as set forth in claim 11, wherein molding and curing the first layer and the second layer around the component assembly includes performing the molding and the curing in a single operation.

13. The method as set forth in claim 12, wherein molding and curing includes applying at least one of, but not limited to, heat and pressure.

14. The method as set forth in claim 12, wherein performing the molding and the curing in a single operation includes.

15. The method as set forth in claim 14, wherein selecting base elastomers with a compatible cross-linking agent includes selecting a peroxide based cross-linking agent.

16. The method as set forth in claim 10, wherein interlinking the first layer with the second layer includes:

compounding the first layer for a low stiffness, lower than the second layer; and compounding the second layer for a high stiffness, higher than the first layer.

17. The method as set forth in claim 16, wherein compounding the first layer for the low stiffness and compounding the second layer for the high stiffness includes:

causing the first layer to have a Shore A hardness between 25 and 60; and causing the second layer to have a Shore D hardness between 35 and 80.

18. The method as set forth in claim 10, wherein interlinking the first layer with the second layer includes:

compounding the first layer for a high stiffness, higher than the second layer; and compounding the second layer for a low stiffness; lower than the first layer.

19. The method as set forth in claim 16, wherein compounding the second layer for the high stiffness includes:

selecting an elastomer having the same base elastomer as the first layer, and selecting a thermoplastic having a glass transition temperature below a cross-linking temperature of the first layer and the second layer, the thermoplastic having a glass transition temperature below a desired maximum processing temperature.

20. The method as set forth in claim 19, wherein selecting the thermoplastic includes selecting a one of, but not limited to, thermoplastic epoxy, amorphous polyamide, styrenic, cellulosic, and non-crystalline polyester.

21. The barrier system of claim 1, wherein the second layer further comprises a thermoplastic, the thermoplastic having a glass transition temperature below a cross-linking temperature of the first layer and the second layer, the thermoplastic having a glass transition temperature below a desired maximum processing temperature.

22. The barrier system of claim 1, wherein the base elastomer of the first and second layers is a millable polyurethane.

23. The barrier system of claim 22, wherein the first layer is compounded with dioctylsebacate or aliphatic oil.

24. The barrier system of claim 1, wherein the base elastomer of the first and second layers is a nitrile rubber.

25. The barrier system of claim 1, wherein the base elastomer of the first layer is a nitrile rubber and the base elastomer of the second layer is a nitrile PVC copolymer.

26. The barrier system of claim 25, wherein the first layer is compounded with oligomeric polyisoprene and the second layer is compounded with PVC powder.

* * * * *